United States Patent
Qin

(10) Patent No.: US 10,466,755 B2
(45) Date of Patent: Nov. 5, 2019

(54) POWER SUPPLY

(71) Applicant: Lenovo (Beijing) Co., Ltd., Beijing (CN)

(72) Inventor: Shijuan Qin, Beijing (CN)

(73) Assignee: LENOVO (BEIJING) CO., LTD., Beijing (CN)

( * ) Notice: Subject to any disclaimer, the term of this patent is extended or adjusted under 35 U.S.C. 154(b) by 0 days.

(21) Appl. No.: 16/135,549

(22) Filed: Sep. 19, 2018

(65) Prior Publication Data

US 2019/0086977 A1    Mar. 21, 2019

(30) Foreign Application Priority Data

Sep. 19, 2017    (CN) .......................... 2017 1 0849882

(51) Int. Cl.
*G11C 5/14*       (2006.01)
*G06F 1/26*       (2006.01)

(52) U.S. Cl.
CPC ................ *G06F 1/263* (2013.01); *G11C 5/14* (2013.01)

(58) Field of Classification Search
CPC ........ G11C 16/10; G11C 11/4074; G11C 5/14
See application file for complete search history.

(56) References Cited

U.S. PATENT DOCUMENTS

| | | | | |
|---|---|---|---|---|
| 5,369,618 A | * | 11/1994 | Takasugi | G11C 7/103 365/221 |
| 2011/0063902 A1 | * | 3/2011 | Lung | G11C 7/067 365/163 |
| 2018/0004596 A1 | * | 1/2018 | Zhang | G11C 29/50 |
| 2019/0107972 A1 | * | 4/2019 | Lee | G06F 3/0659 |

* cited by examiner

*Primary Examiner* — Tuan T Nguyen
(74) *Attorney, Agent, or Firm* — Anova Law Group, PLLC

(57) ABSTRACT

A power control device includes a memory device and a resistor coupled to the memory device. The memory device includes a first memory block storing a plurality of groups of performance parameters and a second memory block storing a power supply program. A resistance of the resistor corresponds to one of the groups of performance parameters. The power control device is configured to control power supply to an electronic device coupled to the power control device according to the power supply program and the one of the groups of performance parameters corresponding to the resistance of the resistor.

10 Claims, 7 Drawing Sheets

POWER SUPPLY

CROSS-REFERENCES TO RELATED APPLICATION

This application claims priority to Chinese Patent Application No. 201710849882.2, filed on Sep. 19, 2017, the entire contents of which are hereby incorporated by reference.

TECHNICAL FIELD

The present disclosure generally relates to the technical field of power supply and, more particularly, to a digital power supply, a system and a method for implementing digital power supply, and a digital power supply group.

BACKGROUND

Currently, power control chips of the CPU and memory of a server are often digital power control chips. During the stage of research and development, the power supply engineers may debug based on the testing conditions of the power supply of the server motherboard to find a version of power supply program that is most suitable for mass production of the motherboard. The power supply program may be burned into the digital power control chip during the production of the motherboard.

In a traditional 2-socket server, a group of CPUs may use two digital power control chips having the same type, and a group of memories may use four digital power control chips having the same type. In the traditional 4-socket server, a group of CPUs may use four digital power control chips of the same type, and a group of memories may use eight digital power control chips of the same type. For an 8-socket server or a server with an even greater number of sockets, a group of CPUs or a group of memories may require more digital power control chips of the same type.

Often, to prevent the factory from making mistakes during burning, the power supply program of each type of digital power control chip may only be burned with one kind of code.

However, because the designs of the printed circuit boards (PCBs) for the power supplies of different groups of CPUs or memories are different and the combinations of components in the peripheral circuit such as capacitors and/or resistors vary from one to another, to enable the same type of power supply program to support multiple groups of power supplies simultaneously, some performances of certain groups of power supplies need to be sacrificed. Further, the power supply engineers need to test, debug and select between different groups of powers repeatedly, which elongates the duration of research and development.

BRIEF SUMMARY OF THE DISCLOSURE

In accordance with the disclosure, there is provided a power control device including a memory device and a resistor coupled to the memory device. The memory device includes a first memory block storing a plurality of groups of performance parameters and a second memory block storing a power supply program. A resistance of the resistor corresponds to one of the groups of performance parameters. The power control device is configured to control power supply to an electronic device coupled to the power control device according to the power supply program and the one of the groups of performance parameters corresponding to the resistance of the resistor.

Also in accordance with the disclosure, there is provided a computing system including an electronic device and a power control device coupled to the electronic device. The power control device includes a memory device and a resistor coupled to the memory device. The memory device includes a first memory block storing a plurality of groups of performance parameters and a second memory block storing a power supply program. A resistance of the resistor corresponds to one of the groups of performance parameters. The power control device is configured to control power supply to the electronic device according to the power supply program and the one of the groups of performance parameters corresponding to the resistance of the resistor.

Also in accordance with the disclosure, there is provided a method including writing a plurality of groups of performance parameters into a first memory block of a power control device, writing a power supply program into a second memory block of the power control device, and, based on the power supply program and a resistance of a resistor coupled to the power control device, determining one of the groups of performance parameters to determine power supply to an electronic device.

BRIEF DESCRIPTION OF THE DRAWINGS

In order to more clearly illustrate technical solutions in embodiments of the present disclosure, drawings for describing the embodiments are briefly introduced below. Obviously, the drawings described hereinafter are only some embodiments of the present disclosure, and it is possible for those ordinarily skilled in the art to derive other drawings from such drawings without creative effort.

DETAILED DESCRIPTION

Figure 1:
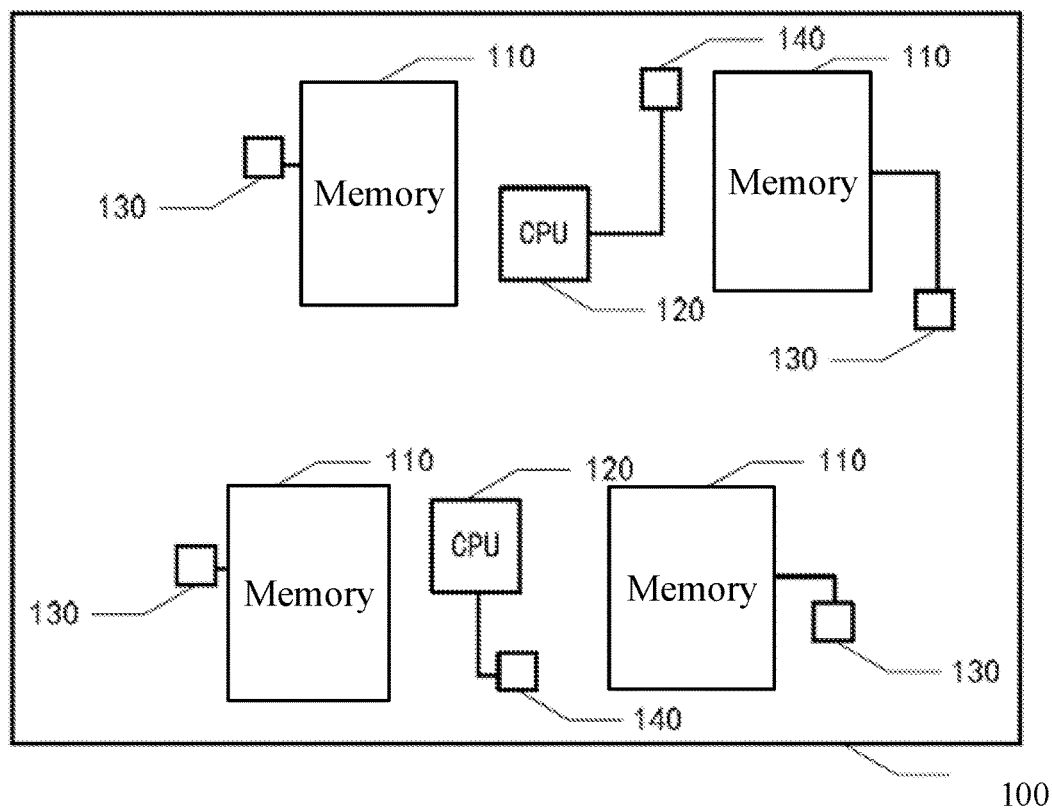
FIG. 1 is an example of an application scenario applicable to a digital power supply, a system thereof, a method for implementing digital power supply, and a digital power supply group.

Various solutions and features of the present disclosure will be described hereinafter with reference to the accompanying drawings. It should be understood that, various modifications may be made to the embodiments described below. Thus, the specification shall not be construed as limiting, but is to provide examples of the disclosed embodiments. Further, in the specification, descriptions of well-known structures and technologies are omitted to avoid obscuring concepts of the present disclosure.

The terminology used herein is for the purpose of describing specific embodiments and is not intended to be limiting of the present disclosure. As used herein, the singular forms "a," "an," and "the" are intended to include the plural forms as well, unless the context clearly indicates otherwise. Further, the terms "include," "including," "comprise," and "comprising" specify the presence of the stated features, steps, operations, components, and/or portions thereof, but do not exclude the possibility of the existence or adding one or more other features, steps, operations, components, and/or portions thereof.

As used herein, the term "and/or" includes any and all combinations of one or more of the associated listed items. Expression such as "at least one of" when preceding a list of elements modifies the entire list of elements, rather than the individual elements of the list.

Unless other defined, all terms including technical and scientific terms used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Some block diagrams and/or flowcharts are provided in the accompanying drawings. It is understood that some blocks of the block diagrams and/or flowcharts, and combinations of blocks in the block diagrams and/or flowcharts, can be implemented by computer program instructions. These computer program instructions may be provided to a processor of a general purpose computer, special purpose computer, or another programmable data processing apparatus, such that the instructions, when being executed by the processor, may create a device for implementing functions/operations specified in the block diagrams and/or flowcharts.

Accordingly, technical solutions of the present disclosure may be implemented in the form of hardware and/or software (including firmware, micro-code, etc.). Furthermore, exemplary embodiments may take the form of a computer program product on a computer-readable storage medium having computer-readable program code embodied in the medium for use by or in connection with an instruction execution system. In the context of present disclosure, a computer-usable or computer-readable medium may be any medium that can contain, store, communicate, propagate, or transport the program for use by or in connection with the instruction execution system, apparatus, or device.

The computer-readable storage medium may, for example, include but not limited to: an electronic, magnetic, optical, electromagnetic, infrared, or semiconductor system, apparatus, device, or propagation medium. Specific examples of the computer-readable storage medium may include: magnetic storage device, such as magnetic tape or hard drive disk (HDD); optical storage device, such as optical disk (CD-ROM); memory, such as random access memory (RAM) or flash drive; and/or wired or wireless communication links.

The present disclosure provides a digital power supply, a digital power supply group, a digital power supply system, and a method for implementing digital power supply. The digital power supply includes a power supply body and an external resistor. The power supply body may include a first memory block and at least one second memory block. The first memory block may store a plurality of groups of performance parameters of the digital power supply, and the at least one second memory block may store power supply programs for implementing the power-supplying function of the digital power supply. The external resistor is connected to the digital power supply body, and the resistance of the external resistor is configured to determine a group of performance parameters that configures the function of the digital power supply from the plurality of groups of performance parameters.

Further, the present disclosure may be applied to a plurality of power-supplying scenarios. For example, the disclosed digital power supply may be applied to charging the CPUs and memories in a server such as a 2-socket server, a 4-socket server, or an 8-socket server.

By applying the present disclosure, the same type of power supply program can be used to simultaneously support each digital power supply of the same group of digital power supplies configured to charge the CPUs or memories included in the 2-socket server, 4-socket server, or 8-socket server. Further, each digital power supply may maximize its performance without sacrificing certain portions of performance.

FIG. 1 is an example of an application scenario applicable to a digital power supply, a digital power supply system, a method for implementing digital power supply, and a digital power supply group. As shown in FIG. 1, a 2-socket server 100 includes a group of four memories 110, a group of two central processing units (CPUs) 120, four digital power supplies 130 for powering the memories 110, and two digital power supplies 140 for powering the CPU 120. In some embodiments, in the 2-socket server 100, the four digital power supplies 130 that power the group of four memories 110 may be the same, and the two digital power supplies 140 that power the group of two CPUs 120 may be the same.

In some embodiments, the designs of the printed circuit boards (PCBs) for the power supplies of different groups of CPUs or memories may be different, and the combinations of components in the peripheral circuit such as capacitors and/or resistors may vary from one to another. While in existing technologies, some performances of certain power supplies need to be sacrificed to allow the same type of power supply program to support multiple groups of power supplies simultaneously, the present disclosure enables the same type of power supply program to support digital power supplies in the same group at approximately the same time without sacrificing the performance.

Further, the aforementioned application scenario is provided merely for illustrative purposes, and embodiments of the present disclosure are not limited thereto. That is, the disclosed embodiments may be applicable to any appropriate application scenarios.

Figure 2:
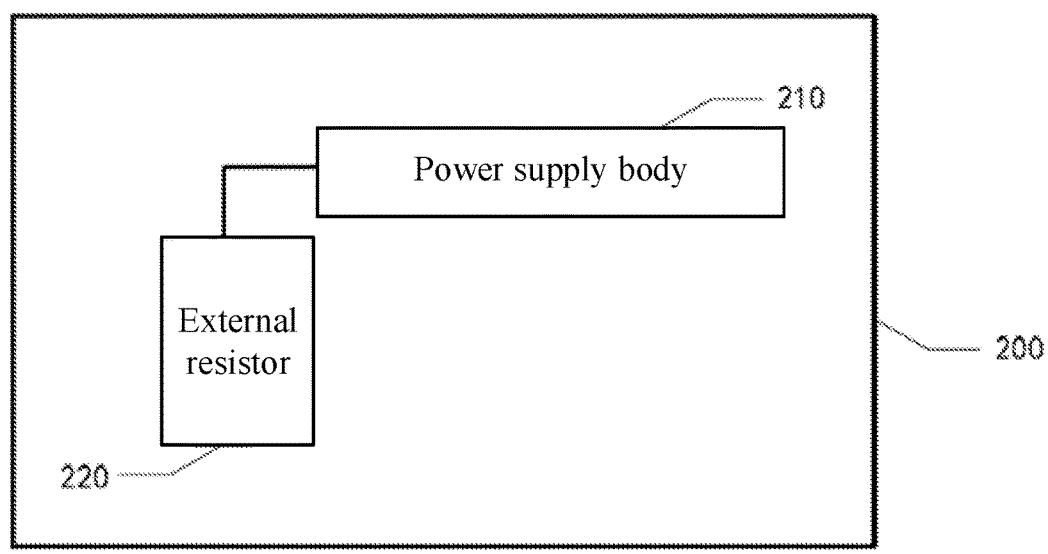
FIG. 2 illustrates a schematic view of an example of a digital power supply.

FIG. 2 illustrates a schematic view of an example of a digital power supply. As shown in FIG. 2, a digital power supply 200 includes a digital power supply body 210 and an external resistor 220. The digital power supply body 210 may include a first memory block and at least one second memory block. The first memory block may store a plurality of groups of performance parameters of the digital power supply 200. The at least one second memory block may store a power supply program that realizes the power-supplying function of the digital power supply 200.

In some embodiments, the first memory block and the at least one second memory block may be configured in a memory device of the digital power supply body 210. For example, the first memory block and the at least one second memory block may be disposed in a non-volatile memory (NVM), and the present disclosure is not limited thereto.

The first memory block may store a plurality of groups of performance parameters, and each group of performance parameters may individually characterize the power supply properties of the digital power supply 200. Given any digital power supply 200, if different performance parameters are selected for the digital power supply 200, the power supply performance presented by the digital power supply 200 can be different. Each group of performance parameter may, for example, include output voltage, output current, and/or rated power.

The at least one second memory block may store a power supply program, and the power supply program may be configured to implement the power supply function of the digital power supply 200. It should be noted that, when the power supply program is very large, the power supply program may be stored in a plurality of second memory blocks.

In some embodiments, the different groups of performance parameters stored in the first memory block may be combined with the power supply program, resulting in the digital power supply 200 having different performance parameters.

For example, the first memory block may store four groups of performance parameters, and each group of performance parameters may at least include output voltage, output current, and rated power. In the first group of performance parameters, the output voltage may be approximately 12 V, the output current may be approximately 30 A, and the rated power may be approximately 360 W. In the second group of performance parameters, the output voltage may be approximately 10 V, the output current may be approximately 50 A, and the rated power may be approximately 500 W. In the third group of performance parameters, the output voltage may be approximately 22 V, the output current may be approximately 40 A, and the rated power may be approximately 880 W. In the fourth group of performance parameters, the output voltage may be approximately 16 V, the output current may be approximately 20 A, and the rated power may be approximately 320 W.

In the aforementioned example, the power supply program can be very large. Thus, the power supply program may be stored in two second memory blocks. Further, the first group of performance parameters may be combined with the power supply program in the two second memory blocks, thereby realizing a digital power supply 200 that has an output voltage of approximately 12 V, an output current of approximately 30 A, and a rated power of approximately 360 W. The second group of performance parameters may be combined with the power supply program in the two second memory blocks, thereby realizing a digital power supply 200 that has an output voltage of approximately 10 V, an output current of approximately 50 A, and a rated power of approximately 500 W. Further, the third group of performance parameters may be combined with the power supply program in the two second memory blocks, thereby realizing a digital power supply 200 that has an output voltage of approximately 22 V, an output current of approximately 40 A, and a rated power of approximately 880 W. The fourth group of performance parameters may be combined with the power supply program in the two second memory blocks, thereby realizing a digital power supply 200 that has an output voltage of approximately 16 V, an output current of approximately 20 A, and a rated power of approximately 320 W.

The external resistor 220 is coupled to the power supply body 210. In some embodiments, the external resistor 220 is coupled to the memory device of the power supply body 210. The resistance of the external resistor 220 may be configured to determine one group of performance parameters that participate in determination of the functions of the digital power supply from the plurality groups of performance parameters.

For example, referring to the aforementioned example, when the resistance of the external resistor 220 is approximately 1 K ohm, the first group of performance parameters may be used. When the resistance of the external resistor 220 is approximately 2 K ohm, the second group of performance parameters may be used. When the resistance of the external resistor 220 is approximately 15 K ohm, the third group of performance parameters may be used. When the resistance of the external resistor 220 is approximately 25 K ohm, the fourth group of performance parameters may be used.

That is, for example, when the resistance of the external resistor 220 is 2 K ohm, the second group of performance parameters is the group of performance parameters that configures the function of the digital power supply 200. Further, the second group of performance parameters may be combined with the power supply program in the two second memory blocks, thereby obtaining the digital power supply 200 with an output voltage of approximately 10 V, an output current of approximately 50 A, and a rated power of approximately 500 W.

Different from the disclosed technical solutions, in existing technologies, when mass production is performed in an application scenario similar to that shown in FIG. 1, the same power supply program may be burned into two digital power control chips (carriers of the digital power supplies 140) of a same model. Under situations where the power supply programs (also known as "codes") are the same, a power supply engineer needs to repeatedly test and debug the digital power supplies 140 of two CPUs 120 to ensure that the two digital power supplies 140 satisfy the requirements of the performance. Further, because the designs of the PCBs for the two digital power supplies 140 may be different and the combinations of components in the peripheral circuit such as capacitors and/or resistors may vary from one to another, when the same power supply program is used, even if the digital power supplies 140 are repeatedly tested and debugged, the performance of the two digital power supplies 140 can hardly be satisfying. Similarly, for the digital power supplies 130 for the four memories 110, it takes even more time for the power supply engineer to perform debugging and testing. Further, because the four digital power supplies 130 use the same power supply program, more factors need to be evaluated for achieving a satisfied digital power supply.

In contrast, consistent with embodiments of the disclosure, different groups of the performance parameters and the power supply program of the digital power supply 200 may be stored in the power supply body, and the different resistances of the external resistors 220 may determine different groups of performance parameters for use. Thus, under the situation where the same power supply program is used to support a plurality of power supplies, the performance of the digital power supply can be improved or maximized. Further, the power supply engineer no longer needs to conduct repeated testing and debugging, which shortens the time for research and development.

Further, in some embodiment, the aforementioned external resistor 220 may be detachable. That is, for different external resistors to correspond to different groups of performance parameters, the external resistors may be designed to be detachable.

For example, the external resistor currently coupled to the power supply body may have resistance of approximately 1 K ohm, which causes the digital power supply to appear to be one with the first group of performance parameters. If the second group of performance parameters of the digital power supply is then desired, the external resistor having resistance of approximately 1 K ohm may be replaced with an external resistor having resistance of approximately 2 K ohm. That is, the external resistor coupled to the power supply body may be detachable.

As such, through embodiments of the present disclosure, the external resistor may be designed to be detachable. Thus, the objective of determining different groups of performance parameters using external resistor having different resistances may be realized.

In some embodiments, the external resistor may be a variable resistor. Different resistances of the variable resistor may correspond to different groups of performance parameters stored in the first memory block. Further, the variable resistor may include but not limited to a slide rheostat.

For example, with reference to foregoing examples, the variable resistor may have a current resistance of approximately 15 K ohm, which corresponds to the third group of performance parameters stored in the first memory block. When the resistance of the variable resistor is set to be approximately 25 K ohm, it means the fourth group of performance parameters of the digital power supply is selected.

As such, through the disclosed embodiments, by varying the resistance of the variable resistor, the objective of determining the corresponding group of performance parameters may be realized without repeatedly connecting and disconnecting different external resistors.

In some embodiments, the power supply body includes: a digital power control chip. The digital power control chip may include one or more preset pins, and the external resistor may be connected to a preset pin. The resistance of the external resistor determines the group of performance parameters that configure the function of the digital power supply, and the group of performance parameters that configure the function of the digital power supply may be pre-defined by the power supply program.

Figure 3A:
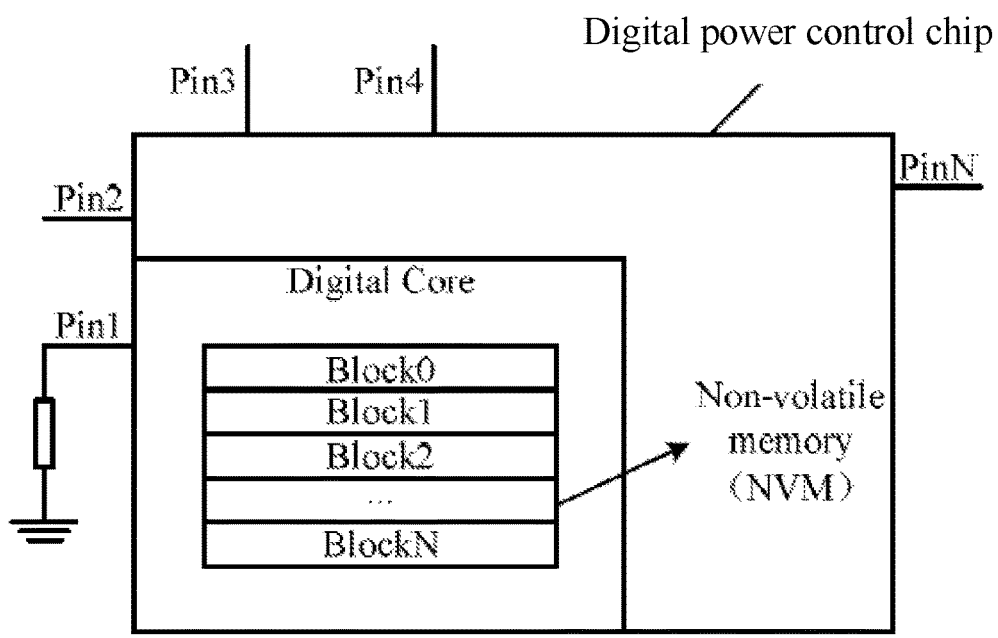
FIG. 3A illustrates a schematic view of another example of a digital power supply.
Figure 3B:
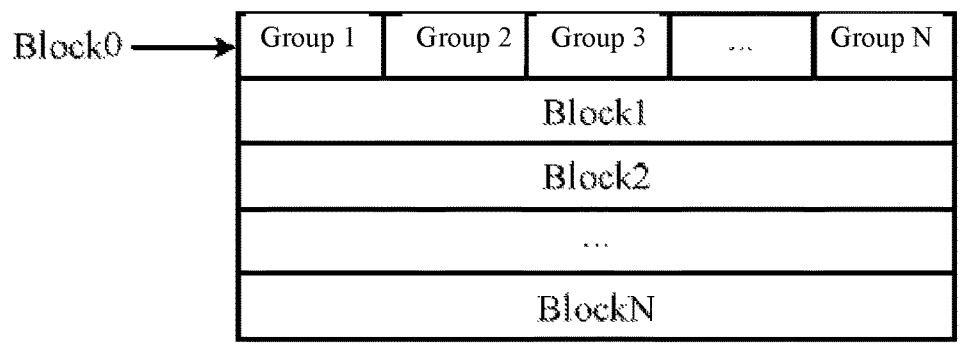
FIG. 3B illustrates a schematic view of an example of a non-volatile memory (NVM)

For example, FIG. 3A illustrates a schematic view of an example of a digital power control chip, and FIG. 3B illustrates a schematic view of an example of the non-volatile memory (NVM). With reference to FIGS. 3A~3B, the block diagram shown in FIG. 2 is described in more detail below.

In some embodiments, as shown in FIG. 3A, the digital power control chip includes a digital core having a non-volatile memory (NVM) as an example of the memory device described above, and the digital power control chip includes a plurality of pins (e.g., Pin1, Pin2, . . . , PinN). Pin1 is, for example, connected to ground via an external resistor. The non-volatile memory includes a first memory block (e.g., Block0) and N second memory blocks (Block1, Block2, . . . , BlockN), where N is a positive integer.

Further, the power supply program may be burned into the non-volatile memory of the digital power control chip, thus implementing the power supply body. The content of the power supply program may depend on the actual testing results of the voltage circuit on the circuit board. In the non-volatile memory, the first memory block (e.g., Block0) may store the values of a plurality of registers, where the values of the plurality of registers are used as the performance parameters of the digital power supply. The non-volatile memory further includes N second memory blocks (e.g., Block1, Block2, . . . , BlockN). During each burning process, the content for Block0~BlockN may be burnt into the digital core of the digital power control chip.

In some embodiments, as shown in FIG. 3B, the Block0 may store values of "group 1," "group 2," . . . , and "group N." Each group may store one or more performance parameters, and the one or more parameters may be determined by a power supply engineer during the research, development, and debugging process. Though during each burning process, the content for Block0 to BlockN is burned into the digital core, in practical use, only one group of performance parameters in Block0 participates in the digital control of the chip.

As such, the disclosed power supply body may include a digital power control chip, and the digital power control chip may include a preset pin (e.g., Pin1). Pin1 may be coupled to the non-volatile memory and correspond to Block0 of the non-volatile memory, and the resistance between Pin1 and the ground may determine the specific group of register values (i.e., the specific group of performance parameters) to configure the digital control of the chip. The resistance of the external resistor and the corresponding group number may be pre-defined in the digital power control chip. In implementation, the external resistor may be connected to the preset pin, Pin1, such that different resistances of the external resistor coupled to Pin1 may determine different groups of performance parameters. The digital power control chip and the external resistor are coupled to each other and constitute a power control device or a portion of the power control device. The power control device is configured to control power supply to an electronic device coupled to the power control device according to the power supply program and the one of the groups of performance parameters corresponding to the resistance of the resistor.

For example, the resistance of approximately 10 K ohm may correspond to "Group 1," the resistance of approximately 20 K ohm may correspond to "Group 2," and the resistance of approximately 30 K ohm may correspond to "Group 3." Further, because different resistances of the external resistor coupled to Pin1 can allow different register groups of Block0 to participate in practical functions, for the digital power control chip of the same model, even if the same power supply program is burned into the memory, the eventually exhibited digital control can be different.

It should be noted that, during research, development, and debugging by a power supply engineer, the portions indicating difference between different digital power supplies (i.e., different performance parameters) can be placed in "Group 1," "Group 2," . . . , and "Group N" of Block0. Further, the same content of different digital power supplies can be stored in Block1, Block2, . . . , and/or BlockN.

For example, DDR_A, DDR_B, DDR_C, and DDR_D may be digital power supplies for four memories, each including a digital power control chip. The models of the digital power control chips used by the four digital power supplies may be the same. After the power supply engineer completes debugging, the same portion of the power supply programs of the four digital power supplies may be written in Block1, Block2, . . . , BlockN, and different portions may be written in respective groups of Block0.

In other words, "Group 1" may store the portion of the content of DDR_A that is different from the contents of DDR_B, DDR_C, and DDR_D, and the digital power control chip may be connected to a resistor having resistance of approximately 1 K ohm through Pin1. Similarly, "Group 2" may store the portion of the content of DDR_B that is different from the contents of DDR_A, DDR_C, and DDR_D, and the digital power control chip may be connected to a resistor having resistance of approximately 2 K ohm through Pin1. Similarly, "Group 3" may store the portion of the content of DDR_C that is different from the contents of DDR_A, DDR_B, and DDR_D, and the digital power control chip may be connected to a resistor having resistance of approximately 3 K ohm though Pin1. Similarly, "Group 4" may store the portion of the content of DDR_D that is different from the contents of DDR_A, DDR_B, and DDR_C, and the digital power control chip may be connected to a resistor having resistance of approximately 4 K ohm through Pin1.

Accordingly, during mass production, for a factory, the power supply program burned for the digital power supplies of the four memories DDR_A, DDR_B, DDR_C, and DDR_D may be the same. For the power supply engineer, the resistance of the external resistors coupled to the Pin1s of the four digital power control chips can be different and the groups of performance parameters can be different, thus yielding four different digital power supplies. Further, though the peripheral designs of different digital power supplies may differ, the performance of each power supply may be maximized.

Consistent with the disclosure, when different power supplies on the circuit board all use the digital power control chips of the same model, even if the burned power supply program remains the same, the forms that the digital power supplies appear to be can be different. Thus, the performance of each digital power supply can be improved.

Figure 4:
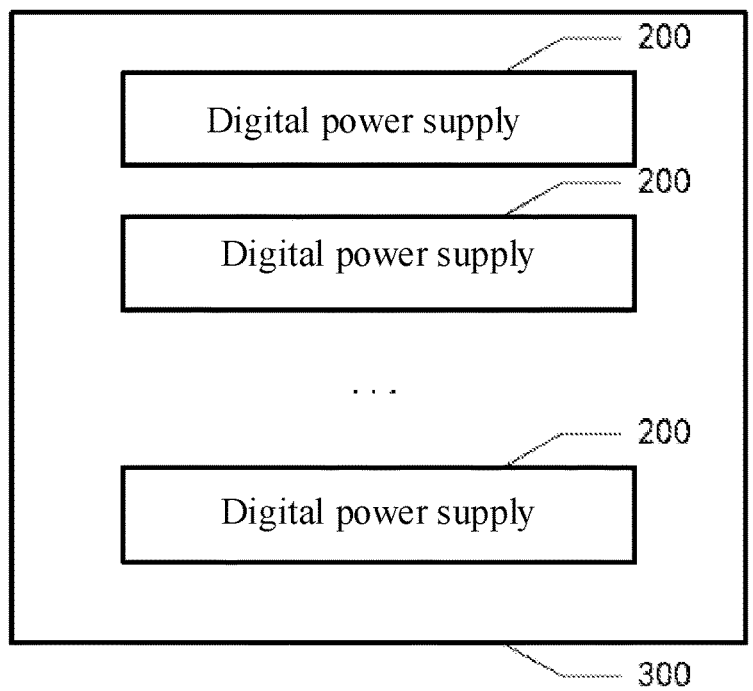
FIG. 4 illustrates a block diagram of an example of a digital power supply group.

FIG. 4 illustrates a block diagram of an example of a digital power supply group. As shown in FIG. 4, a digital power supply group 300 includes a plurality of digital power supplies 200. Further, a digital power supply 200 may be a digital power supply consistent with the disclosure, such as one of the above-described example digital power supplies, and includes a power control device as described above, a description of which is not repeated herein.

The number of digital power supplies 200 included in each digital power supply group 300 may be configured based on needs of the user and/or actual application scenarios and can be, for example, one, two, three, four, five, six, seven, eight, or more. For example, for a 2-socket server, two CPUs may be included. Correspondingly, the digital power supply group 300 may include two digital power supplies 200 that are configured to power the two CPUs. Similarly, for a 4-socket server, four CPUs are included, and the digital power supply group 300 may include four digital power supplies 200 that are configured to power the four CPUs. For an 8-socket server, eight CPUs are included, and the digital power supply group 300 may include eight digital power supplies 200 that are configured to power the eight CPUs.

Consistent with the disclosure, the digital power supply group 300 may be utilized to power a plurality of power-consuming objects, e.g., a plurality of electronic devices, simultaneously, which improves the convenience of the power supply and saves the resources of the system. Further, by applying the technical solutions of the present disclosure, the power supply program of a same type may support different digital power supplies in a group of digital power supplies simultaneously, and each digital power supply may have a satisfying performance.

Figure 5:
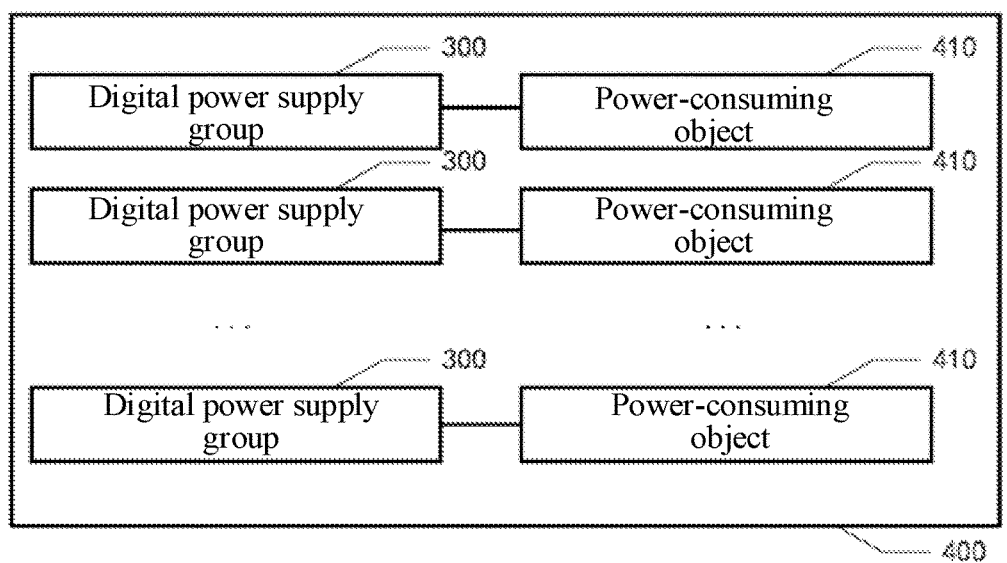
FIG. 5 illustrates a block diagram of an example of a digital power supply system.

FIG. 5 illustrates a block diagram of an example of a digital power supply system, also referred to as a "computing system." As shown in FIG. 5, the digital power supply system 400 may include at least one digital power supply group 300 and at least one power-consuming object 410, e.g., at least one electronic device. Further, different digital power supply groups may supply power to different power-consuming objects. In some embodiments, the at least one power-consuming object includes a CPU. In some embodiments, the at least one power-consuming object includes a memory.

Further, each digital power supply group 300 may include one or more digital power supplies 200. A digital power supply 200 may be a digital power supply described in any of aforementioned embodiments and include a power control device described above, which is not repeatedly described herein.

The number of digital power supplies 200 included in each digital power supply group 300 may be configured based on needs of the user and the number of power-consuming objects in practical application scenarios.

For example, the digital power supply system 400 may include one digital power supply group 300 and power-consuming objects 410 of one type, and the power-consuming objects 410 of one type may include two power-consuming objects 410. Thus, two digital power supplies 200 may be correspondingly configured in the digital power supply group 300, and the two digital power supplies 200 may be configured to power the two power-consuming objects 410, respectively.

In some embodiments, the digital power supply system 400 may include two digital power supply groups 300 and power-consuming objects 410 of two types. A first digital power supply group 300 may be configured to power the power-consuming objects 410 of a first type, and a second digital power supply group 300 may be configured to power the power-consuming objects 410 of a second type.

For example, if there are four power-consuming objects 410 of the first type, four digital power supplies 200 may be configured in the first digital power supply group 300 and the four digital power supplies 200 may be configured to power the four power-consuming objects, respectively. If there are eight power-consuming objects 410 of the second type, the second digital power supply group 300 may include eight digital power supplies 200 and the eight digital power supplies 200 may be configured to power the eight power-consuming objects, respectively.

As such, consistent with the disclosure, the digital power supply group(s) of the digital power supply system may power the power-consuming object(s) directly without connecting to an external digital power supply, which reduces the resource consumption of the system. Further, through the disclosed technical solutions, the power supply program of a same type may support different digital power supplies in a group of digital power supplies simultaneously, and each digital power supply may achieve satisfying performances.

Figure 6:
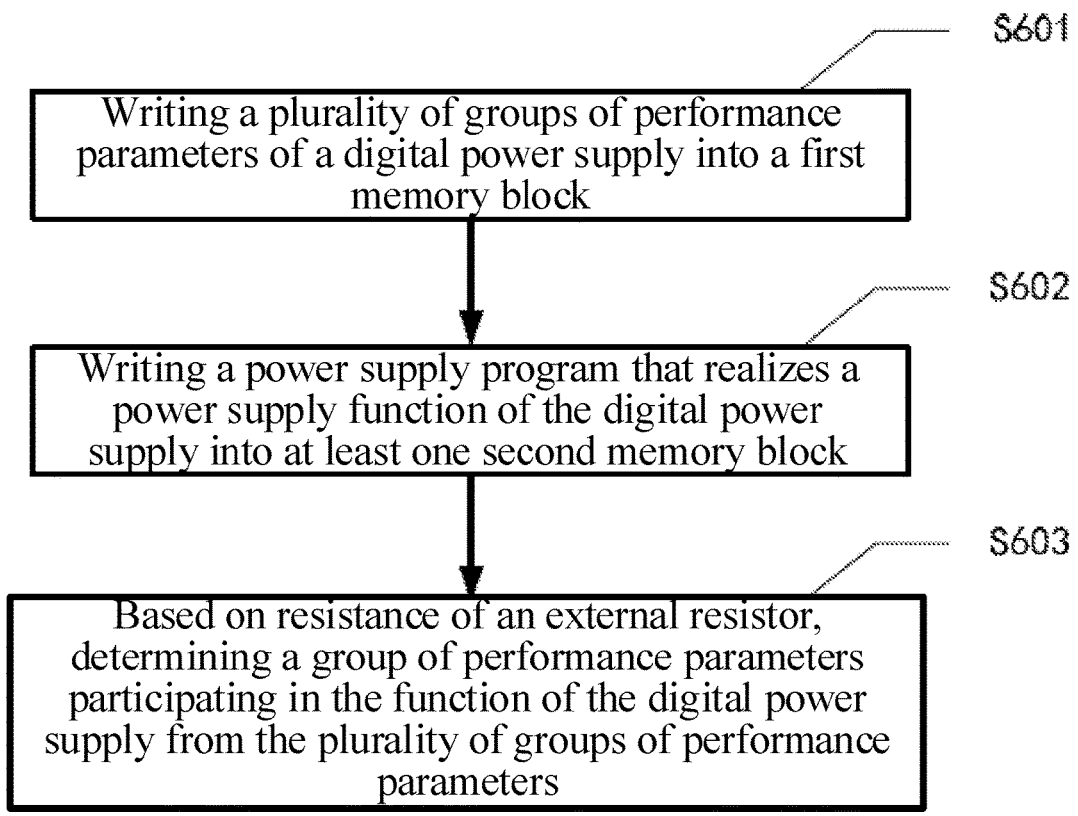
FIG. 6 illustrates a flow chart of an example of a method for implementing digital power supply.

FIG. 6 illustrates a flow chart of an example of a method for implementing digital power supply. As shown in FIG. 6, the method for implementing digital power supply may include followings.

At S601, a plurality of groups of performance parameters of a digital power supply is written into a first memory block. The first memory block may be included in a power supply body of the digital power supply.

At S602, a power supply program that realizes a power supply function of the digital power supply is written into at least one second memory block. The at least one second memory block may also be included in the power supply body.

At S603, based on resistance of an external resistor, a group of performance parameters participating in the function of the digital power supply is determined from the plurality of groups of performance parameters. The external resistor is coupled to the power supply body.

As described above, the power supply body may include a digital power control chip, which may include a memory device including the first memory block and the at least one second memory block and is coupled to the external resistor. Further, the digital power control chip and the external memory constitute a power control device or a portion of the power control device. Therefore, the first memory block and the at least one second memory block can also be considered as being parts of the power control device.

Consistent with the disclosure, different groups of performance parameters of the digital power supply 200 and the power supply program are stored in the power supply body. Further, the resistance of the external resistor 220 can be varied or external resistors with different resistances can be applied to determine different groups of performance parameters. Thus, under the situation where the power supply program of a same type is applied to support a plurality of power supplies, the performance of the digital power supply may be maximized. Further, the power supply engineer does not need to conduct repeated testing and debugging, which shortens the duration of research and development.

Figure 7:
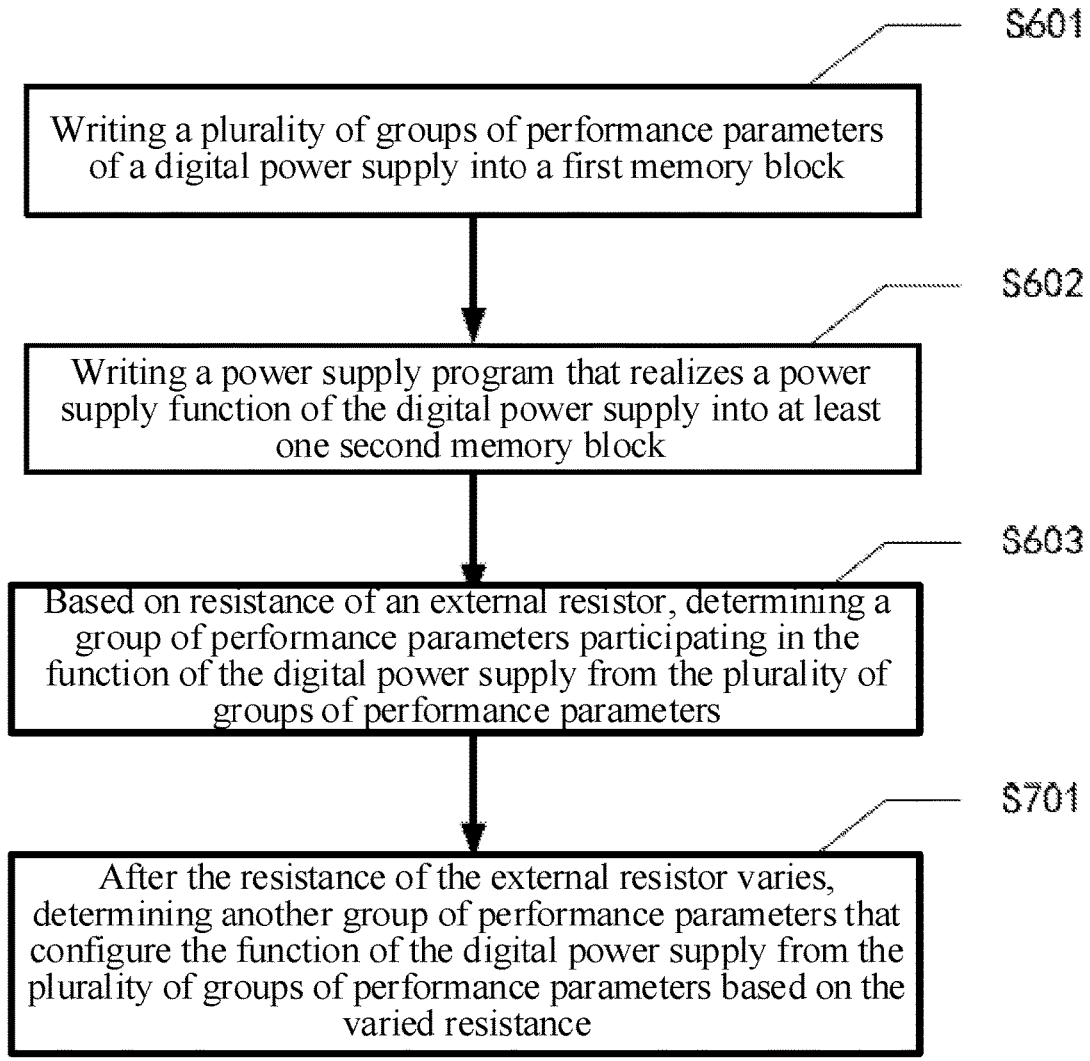
FIG. 7 illustrates a flow chart of another example of a method for implementing digital power supply.

FIG. 7 illustrates a flow chart of another example of a method for implementing digital power supply. As shown in FIG. 7, in addition to the operations S601~S603 described above with reference to FIG. 6, the method further includes after the resistance of the external resistor changes, determining another group of performance parameters that configure the function of the digital power supply from the plurality of groups of performance parameters based on the changed resistance (S701).

Consistent with the disclosure, when the plurality of power supplies on the circuit board use digital power control chips of the same model, even if the burned power supply program is the same, the forms that different digital power supplies appear to be can differ. Thus, each digital power supply can have satisfying performance.

It should be understood that, the power supply body 210 may be realized in one module or may be realized by a plurality of modules. Similarly, the digital power supply group 300 may be realized in one module or may be realized by a plurality of modules.

Further, at least one of the power supply body 210, the digital power supply 200, the digital power supply group 300, or the power-consuming object 410 can be at least partially implemented as a hardware circuit, such as field-programmable gate array (FPGA), programmable logic array (PLA), system on chip (SOC), system on the substrate, system on package, application-specific integrated circuit (ASIC).

In some embodiments, at least one of the power supply body 210, the digital power supply 200, the digital power supply group 300, or the power-consuming object 410 may be implemented using hardware or firmware configured to integrate or package the circuit in any other appropriate manner or may be implemented in an appropriate combination of the three implementation manners of software, hardware, and firmware.

In some embodiments, at least one of the power supply body 210, the digital power supply 200, the digital power supply group 300, or the power-consuming object 410 may be at least partially realized as a computer program module. When the program is executed by a computer or a processor, the function of the corresponding module may be executed.

Figure 8:
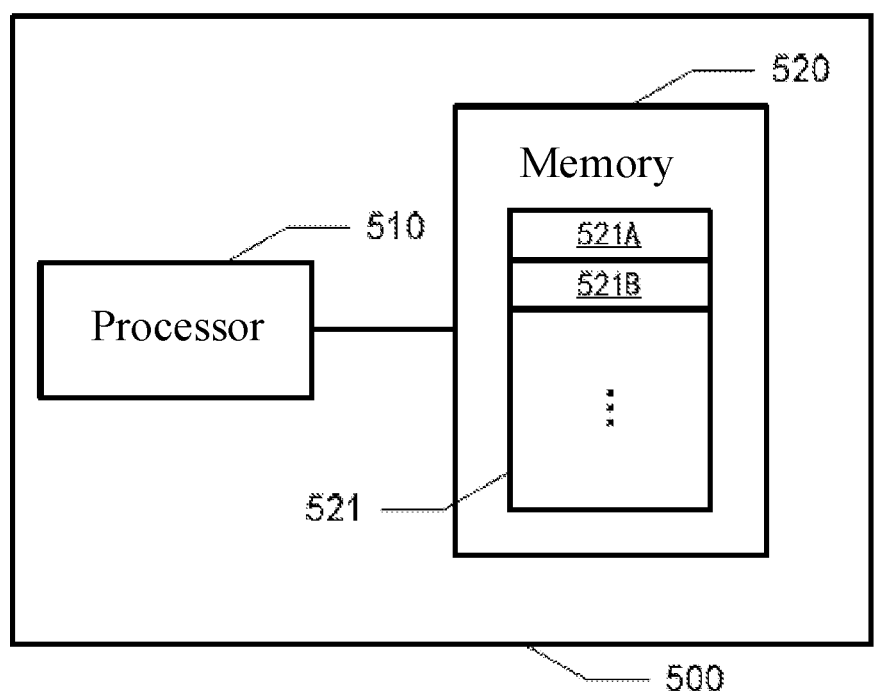
FIG. 8 illustrates a block diagram of an example of a computer system for executing a method for implementing digital power supply.

FIG. 8 illustrates a block diagram of an example of a computer system for executing a method for implementing digital power supply. As shown in FIG. 8, the computer system 500 may include a processor 510 and a memory 520. The computer system 500 may execute the method provided in FIG. 6 or FIG. 7.

The processor 510 may include a general micro-processor, a command set processor, and/or related chip group, and/or specialized micro-processor, such as an ASIC. The processor 510 may further include an onboard memory. Further, the processor 510 may be a single processing unit or include a plurality of processing units for executing different actions of the method described above in connection with FIG. 6 or FIG. 7.

The memory 520 may include any medium that is able to contain, store, propagate or transmit a command. For example, a readable storage medium may include but not limited to electric, magnetic, optical, electromagnetic, infrared, or semiconductor system, device, apparatus, or propagation medium. Specific examples of the readable storage medium may include: magnetic storage device, such as magnetic tape or hard drive disk (HDD); optical storage device, such as CD-ROM; memory, such as random-access memory (RAM) or flash drive; and/or wired or wireless communication link.

The memory 520 may store a computer program 521. The computer program 521 may include code or computer executable command. When being executed by the processor 510, the command may enable the processor 510 to execute the method or any derivative consistent with the disclosure, such as one of those described above in connection with FIG. 6 or FIG. 7.

The computer program 521 may be configured to include computer program codes of the computer program module. For example, the codes of the computer program 521 may include one or more program modules, such as module 521A, module 521B, etc. It should be noted that the division and number of the modules are not fixed, and those skilled in the relevant art may use appropriate program modules or combination thereof based on actual situations. When these program module combination is executed by the processor 510, the processor 510 may execute the method consistent with the disclosure, such as one of those described above in connection with FIG. 6 or FIG. 7, or any derivative thereof.

Various embodiments in the specification are described in a progressive manner, and each embodiment highlights their difference from other embodiments, and different embodiments can be referred to each other for the descriptions of the same or similar parts therebetween.

The aforementioned illustrations of the disclosed embodiments teach those skilled in the relevant art to implement or employ the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A power control device comprising:
   a memory device which includes:
      a first memory block, wherein the first memory block stores a plurality of groups of performance parameters; and
      a second memory block, wherein the second memory block stores a power supply program; and a resistor coupled to the memory device, a resistance of the resistor corresponding to one of the groups of performance parameters, wherein the power control device is configured to control power supply to an electronic device coupled to the power control device according to the power supply program and the one of the groups of performance parameters corresponding to the resistance of the resistor.

2. The power control device according to claim 1, wherein:

the resistor is detachably coupled to the memory device.

3. The power control device according to claim 1, wherein:

the resistor includes a variable resistor, and different resistance values of the variable resistor correspond to different ones of the groups of performance parameters.

4. The power control device according to claim 1, wherein:

the memory is a part of a digital power control chip of the power control device, the digital power control chip includes a pin, the external resistor is coupled to the pin, and the power supply program includes a correspondence relating the groups of performance parameters to different resistances of the external resistor.

5. A power control system, comprising:

one of more of the power control device according to claim 1.

6. A computing system comprising:

an electronic device; and a power control device coupled to the electronic device, wherein the power control device includes:

a memory device, wherein the memory device includes:

a first memory block, wherein the first memory block stores a plurality of groups of performance parameters; and a second memory block, wherein the second memory block stores a power supply program; and a resistor coupled to the memory device, a resistance of the resistor corresponding to one of the groups of performance parameters, wherein the power control device is configured to control power supply to the electronic device according to the power supply program and the one of the groups of performance parameters corresponding to the resistance of the resistor.

7. The system according to claim 6, wherein:

the electronic device includes a CPU.

8. The system according to claim 6, wherein:

the electronic device includes a memory.

9. A method comprising:

writing a plurality of groups of performance parameters into a first memory block of a power control device;

writing a power supply program into a second memory block of the power control device; and based on the power supply program and a resistance of a resistor coupled to the power control device, determining one of the groups of performance parameters to determine power supply to an electronic device.

10. The method according to claim 9, further comprising:

after the resistance of the external resistor changes, determining another one of the groups of performance parameters to determine power supply to the electronic device.

* * * * *